United States Patent [19]

Lee

[11] Patent Number: 4,569,032

[45] Date of Patent: Feb. 4, 1986

[54] DYNAMIC CMOS LOGIC CIRCUITS FOR IMPLEMENTING MULTIPLE AND-FUNCTIONS

[75] Inventor: Charles M. Lee, Berkeley Heights, N.J.

[73] Assignee: AT&T Bell Laboratories, Murray Hill, N.J.

[21] Appl. No.: 564,929

[22] Filed: Dec. 23, 1983

[51] Int. Cl.⁴ .................. H03K 19/017; H03K 19/096
[52] U.S. Cl. .................................... 364/787; 307/452; 307/481
[58] Field of Search ................ 307/443, 448, 451–453, 307/481; 364/787

[56] References Cited

U.S. PATENT DOCUMENTS

| | | | |
|---|---|---|---|
| 3,573,487 | 4/1971 | Polkinghorn | 307/481 X |
| 4,040,015 | 8/1977 | Fukuda | 307/452 X |
| 4,441,158 | 4/1984 | Kanuma | 364/787 X |
| 4,504,924 | 3/1985 | Cook et al. | 364/787 |

FOREIGN PATENT DOCUMENTS

| | | | |
|---|---|---|---|
| 0082773 | 6/1983 | European Pat. Off. | 307/452 |
| 2544434 | 4/1977 | Fed. Rep. of Germany | 307/481 |
| 0079338 | 5/1983 | Japan | 307/481 |

OTHER PUBLICATIONS

Goncalves et al., "A Racefree–Dymamic CMOS Technique for Pipelined Logic Structures"; *Digest of European Solid State Circuits Conference;* Jul. 1982; pp. 141–144.

C. Mead et al., *Introduction to VLSI Systems*, "1.11 Delays in Another form of Logic Circuitry," Addison–Wesley Publishing Company, 1980, pp. 22–23.

H. Taub, *Digital Circuits and Microprocessors*, "5.10 The Look–Ahead Carry Adder," McGraw-Hill Book Company, 1982, pp. 205–209.

R. H. Krambeck et al., "High-Speed Compact Circuits with CMOS", *IEEE Journal of Solid–State Circuits*, vol. SC-17, No. 3, Jun. 1982, pp. 614–619.

C. M. Lee et al., "Current Status and Future Projection of CMOS Technology," *Computer Networks, Proceedings of the 25th IEEE Computer Society International Conference*", (CompCon 82), Washington, D.C., Sep. 1982, pp. 716–719.

*Primary Examiner*—Larry N. Anagnos
*Attorney, Agent, or Firm*—David I. Caplan

[57] ABSTRACT

A dynamic CMOS logic circuit for computing multiple AND functions contains a sequence of at least three successive stages controlled by the same timing signal, each stage having a logic network of driver transistors in which at most three such transistors are connected in series along any path through the network.

3 Claims, 4 Drawing Figures

DYNAMIC CMOS LOGIC CIRCUITS FOR IMPLEMENTING MULTIPLE AND-FUNCTIONS

TECHNICAL FIELD

This invention relates to electronic data processing systems implemented in semiconductor integrated circuits and, more particularly, to integrated logic circuits that employ complementary MOS (CMOS) technology.

BACKGROUND OF THE INVENTION

In electronic data processing systems, there has been increasing interest in semiconductor integrated circuits for computing logic functions, using both n-channel (NMOS) and p-channel (PMOS) enhancement type field-effect transistors because of the improved noise and low power dissipation properties of such circuits. Hereinafter it should be understood that all of the transistors mentioned are enhancement mode unless otherwise indicated.

In a fully complementary CMOS circuit having logic gates in which each PMOS transistor in a given gate is paired with a corresponding NMOS transistor, the logic function of each such logic gate is completely implemented twice, once in an array of PMOS transistors and again in an array of NMOS transistors. The advantage of using the two complete arrays is that, except for the brief time interval during which the outputs or inputs are making transitions, no current flows in the circuit and hence no power is consumed. However, one disadvantage of this approach is the large amount of semiconductor area needed to accommodate the two complete arrays of transistors. Moreover, the extra area and the extra transistors required for the two arrays result in a large capacitive load which undesirably slows the speed of the circuit.

Accordingly, fully complementary CMOS technology has not proved particularly popular. Instead, NMOS technology early became the dominant technology for high speed logic, particularly since an NMOS transistor has a better figure of merit than a PMOS transistor because of the higher mobility of electrons in NMOS than holes in PMOS transistors. On the other hand, as the source to drain distance and hence the channel length of individual PMOS and NMOS transistors is reduced to submicron (about a micron or less) size, the difference in speed and hence in figure of merit between NMOS and PMOS transistors becomes of less importance. However, power dissipation can become a problem in large arrays implemented in either NMOS or PMOS technology.

To retain the main benefits of CMOS technology without the area penalty of complete duplication of the two arrays, workers in the art have developed the circuit technique known as pseudo-NMOS. Pseudo-NMOS technology is a circuit design technique which uses circuits identical to those in NMOS technology except for the substitution of a PMOS pull-up transistor for the load or pull-up NMOS transistor. However, a problem with this approach is that pull-up current always flows in a logic gate of the pseudo-NMOS circuit even when the gate is pulling down, whereby the time required for pull-down is undesirably prolonged. Reducing the pull-up current to a very small value would not solve the problem because then the subsequent pull-up would be correspondingly very slow. As a result, the speed of CMOS and of pseudo-NMOS technology tends to be nearly the same, and the trade-off in choosing one versus the other technology is between the low power of fully complementary CMOS technology and the low semiconductor area of pseudo-NMOS technology.

To achieve circuits which combine both low capacitance and high current capability, various forms of clocked or "dynamic" circuits have been developed. A typical form of such a dynamic circuit—called "dynamic pseudo-NMOS" or "dynamic CMOS"—includes in each logic gate (or "stage") a network (or "cluster") of NMOS driver transistors interconnected to implement a logic function in the same manner as they would be in static NMOS. A PMOS pull-up or "precharging" transistor is connected between the high level ($V_{DD}$) power line of the power source and the output node of the network, and an NMOS pull-down or "power switch" transistor connected between the low level ($V_{SS}$) power line of the power source, typically ground, and the other or second node of the network of NMOS drivers. In general, by "high level" is meant a voltage level which, when applied to the gate electrode of a driver, tends to turn the transistor on. (Thus, in dynamic pseudo-PMOS—i.e., using PMOS drivers—the "high" or "precharge" level would become the low level $V_{SS}$, while the "low" or "ground" level would become the high level $V_{DD}$; the precharging transistor would be NMOS; and the power switch would be PMOS.) In dynamic CMOS operation, the gate electrodes of the pull-up and of the pull-down transistors are clocked together for precharging, so that during each precharge phase of the clock cycle the output node of the network is precharged to essentially the high level, while at the same time the current path from the output node to the low level is open (turned off), regardless of the on-off conditions of the drivers, because the power switch is then off (open). Changing of logic inputs to the network occurs during each such precharge phase. At the completion of the precharge phase, the clock turns off the pull-up transistor to terminate precharging, and turns on the power switch transistor to close the path to the low level and thus to begin the logic computation or "evaluation" phase. Depending upon the high versus low states of the various logic inputs to the various drivers in the network, and hence depending upon the on versus off conditions of the various drivers, the output node will either continue to float at the high precharge level or be pulled down to a lower, essentially $V_{SS}$ level.

Theoretically, the advantage of a dynamic circuit, such as the foregoing pseudo-NMOS, is that its load capacitance is comparable to that of a pseudo-NMOS circuit, but the full pull-down current is available with the result that fast speeds can be realized. Problems arise, however, in realizing these supposed speed advantages in practical circuits, because such circuits generally have several logic networks or "stages" in tandem. In the dynamic approach no such stage can be activated to the evaluation phase until all inputs to that stage have stabilized—i.e., have become valid. Thus, the time allotted for the stages to stabilize must be chosen so that even the stage with the longest delay can stabilize. Moreover, stabilization is complicated because in any given stage (excepting the first stage) any driver coupled to the output node of a preceding stage begins the evaluations phase with input at the high precharge level of the output node of that preceding stage, and hence that driver tends to discharge the output node of the given stage. Accordingly, it is often necessary to include some provision for some delay in the commencement of the evaluation phase of different drivers of the circuit. But this provision results in considerable increase in circuit complexity, particularly when many stages are involved.

One approach that has been developed has been the CMOS domino logic circuit. In its preferred form, each stage in this technology utilizes clusters of NMOS driver transistors for implementing the logic networks and clocked PMOS pull-up transistors for implementing precharge or load elements—all transistors interconnected between a high power terminal connected to a high voltage level power line ($V_{DD}$) and a low power terminal connected to a low voltage level power line ($V_{SS}$). As in a dynamic pseudo-NMOS circuit, during each precharge phase of the clock, every output node is precharged high while the path to the low level, typically ground, is kept open by means of the off state of a power switch supplied by a clocked NMOS transistor; and the precharge phase is terminated when the power switch is turned on and hence the path to ground is closed. A significant characteristic of the domino CMOS circuit is that it includes many stages, each stage implementing either the same or a different logic function, and that the transition from precharge to evaluation phase in all stages is accomplished by means of a single clock edge (or its complement) applied simultaneously to all clocked transistors in all stages of the circuit. To prevent spurious input signals during evaluation, it is important to assure that in each stage (excepting the first) the inputs to any drivers which are coupled to a preceding stage are all low before the beginning of the evaluation phase. To this end, a static inverter is included as a buffer between the output node of each domino stage and the input node of the drivers in any succeeding domino stage to be supplied by such output. During the precharge, when the output node of every stage is momentarily at the high precharge level, the corresponding buffer output of every such stage is low, so that all circuit nodes which connect the output of one domino stage to an input node (gate terminal) of a driver in any other domino stage are low and therefore any such driver is off. Thus during each evaluation phase, such an input node of the driver can experience only a single type of voltage swing or transition, namely, from low to high. All such driver input nodes can make such a low to high transition (at most) only during an evaluation phase and then must stay at the same voltage level until the next precharge phase when they again can experience only a single type of transition (if any), in this case from high to low. Of course, such input nodes need not make any transition if they are already at the appropriate voltage level. As a result, there cannot be any spurious signals or "glitches" at any nodes in the circuit. Thus, all stages may be switched from precharge to evaluation phase—i.e., all pull-up transistors may be switched from on to off—by means of the same clock edge. Moreover, if all drivers in a given stage are supplied with properly timed signals—i.e., all of which are low during all precharge phases—then the power switch in the given stage can be omitted. The voltage developed at the output node of any stage is automatically itself a properly timed signal in this sense.

A domino CMOS logic circuit ideally has a desirably low power consumption since there is never a closed d.c. path from the high level of the power source ($V_{DD}$) to ground ($V_{SS}$). Also, the full pull-down current is available to drive the output nodes. At the same time, the load capacitance is much smaller than that encountered in the standard static CMOS circuit because the cluster of complementary driver transistors have been eliminated. Meanwhile, the use of a single clock edge to activate the entire domino CMOS circuit provides simple operation and full utilization of the speed of each stage.

To avoid undesirable sharing of charge between the output node of a given stage and one or more nodes between drivers of that stage mutually connected in series, auxiliary precharge pull-up transistors can be added for directly precharging such nodes and thus for preventing them from undesirably taking away charge from the output node during evaluation. Such undesirable sharing can otherwise occur when some (but not all) the drivers experience off to on transitions during evaluation.

One limitation of domino CMOS is that the output of each but the last stage must be buffered with an inverter. This requirement of buffering inverters can undesirably consume precious semiconductor area.

In order to obviate the need for the buffering inverters between successive stages of a domino CMOS logic circuit of the form described above, successive stages of a domino CMOS alternate between dynamic pseudo-NMOS and dynamic pseudo-PMOS, i.e., successive stages alternate with purely NMOS and purely PMOS driver transistor clusters, and correspondingly alternate with PMOS and NMOS precharging transistors, respectively. All stages are timed by the same clock edge (or its complement). In addition, in case the input signals to the NMOS (or PMOS) driver transistor of any stage are not necessarily always low (or high) during all precharge phases—i.e., are not properly timed—then an NMOS (or PMOS) power switch transistor is added to that stage. Thus, for example, in a two-stage embodiment, the first stage of the circuit contains solely NMOS drivers together with a PMOS precharge transistor and an NMOS power switch, and the second stage contains solely PMOS drivers with an NMOS precharging transistor and a PMOS power switch. Moreover, in any situation where it is arranged that all the input signals for a given stage are properly timed (i.e., such as to maintain all drivers in that stage in the off condition during the evaluation phases), then the power switch transistor can be omitted from that stage. Such a situation occurs, for example, whenever all such input signals are output signals of another stage having driver transistors all of opposite type from that of the given stage and having its precharge transistor(s) controlled by the same clock edge as that which controls the precharge transistor of the given stage.

In many circumstances in data processing systems, it is desired to implement the multiple AND logic function, that is, the AND function of a multiplicity of input logic variables, n in number. For example, if n=4—and there are thus four logic input variables A, B, C, and D—then it is desired to have an electrical circuit with input signals corresponding to A, B, C, and D such that the output of the circuit is at a high voltage level (logic 1) if and only if the signals A and B and C and D are all high; otherwise, the output should be at a low voltage level (logic 0) whenever any one or more of the input signals is at a low voltage level. In addition, the logical inverse or complement of the AND function is called the NAND function, that is, in which a logic 0 for the AND function becomes a logic 1, and a logic 1 for the AND function becomes a logic 0. Since the difference between the AND function and the NAND function is only an inverter, these two names are interchangeable in the discussion below.

As known in the art, a multiple AND logic circuit element for implementing this function can be formed by a single dynamic pseudo-NMOS stage containing a logic cluster of a multiplicity of NMOS drivers whose source-drain current paths are all connected mutually in series. That such a gate implements an AND function can be seen from the following considerations. If the input to any one (or more) of these drivers is low (logic 0) during evaluation and hence that driver is off, then during evaluation the electrical path from the output node of that stage to ground ($V_{SS}$) is open and hence the output node remains high (logic 1) at its precharge phase level. On the other hand, if all inputs to the stage during evaluation are high (logic 1) and hence all drivers are on, then during evaluation the path from the output node to ground is closed and hence the output node goes to ground (logic 0) during evaluation. Thus the multiplicity of NMOS drivers mutually connected in series indeed implements the AND function; that is, the function is logic 1 if and only if all input variables are logic 1. Such a circuit element suffers from the problem that the required number of drivers connected in series is equal to the number n of input variables. On the other hand, owing to the resistance R of each driver's channel and the capacitance C of each internal node to semiconductor substrate ground ($V_{SS}$), the time it takes for the output node to discharge if and when all drivers are on during a given evaluation phase increases quadratically with the number of drivers, simply because the discharge of a node through a transmission line of identical RC elements in series, n in number, is governed by a diffusion-type equation and is therefore substantially equal to $RCn^2$. See, for example, C. Mead and L. Conway, *Introduction to VLSI SYSTEMS*, 1980, pp. 22–23. Thus, in order to implement a multiple AND circuit by means of n drivers mutually connected in series, the required time duration of each evaluation phase becomes unduly prolonged, and hence the speed of operation becomes undesirably slowed, as the number n of input variables increases above three or four. The higher the value of n, the slower the speed. A similar problem of unduly long evaluation phase arises when implementing a logic network for computing other logic functions of more than three input variables in case the network contains any current path through more than three driver transistors connected in series, such as a carry look-ahead for three bits or more of an arithmetic logic unit. The problem is even more serious, of course, in case there are more than four drivers in series.

Thus, it would be desirable to have a logic circuit for performing the multiple AND function, as well as other functions for four or more input variables, which does not require such a long time duration for evaluation.

Moreover, when thus implementing the multiple AND function of n input variables A, B, C, and D by means of a logic circuit containing a multiplicity of n drivers whose current paths are mutually connected in series, it requires a separate circuit to implement the multiple AND function of fewer than n of the same input variables, such as the AND function of AB, or the AND function of ABC. Therefore, it would be desirable to have a circuit for implementing the AND function of n input variables in such a manner that the circuit contains internal nodes at which signals corresponding to the AND function of fewer than the n input variables are developed.

SUMMARY OF THE INVENTION

In an integrated circuit, in order to implement the AND logic function of four (or more) input logic variables, a dynamic logic circuit arrangement has three (or more) successive stages, each of such stages having a separate logic network of driver transistors in which at most three, and preferably just two, are connected in series along any path through the network of any stage. Advantageously, the timing of all stages is controlled by the same clock edge or its complement, i.e., by the same timing signal. In particular, the logic network of driver transistors of each stage is interconnected between an output node of the stage and a separate d.c. power terminal, the logic network of each such stage being arranged such that no more than three, and preferably just two, of such driver transistors are located along any current path from the output node of the stage through the logic network to the power terminal of the stage, and further arranged such that a first and a second of such driver transistors have their current paths mutually connected in series between the output node of the stage and the power terminal thereof, the input terminal (gate electrode) of a selected one of the driver transistors in each stage (excepting the first) being connected to the output node of the immediately preceding stage. In this way, during operation the output node of each of the various stages (excepting the first) develops an output representing a multiple AND function of an input applied to a driver of that stage combined with inputs applied to drivers of the preceding stage. Such a circuit may be termed "zipper CMOS" because of the resemblance of its operation during evaluation to the closing of a zipper-type mechanical fastener.

In a specific embodiment of the invention, a zipper CMOS logic circuit arrangement has three or more stages. Each stage has a logic network consisting of two separate driver transistors. In the first stage, each of the two drivers have their input terminals connected for receiving first and second input signals, $S_1$ and $S_2$, respectively. In the second stage, one of the two drivers has its input terminal connected to the output node of the first stage, and the other of the two drivers has its input terminal connected for receiving a third input signal $S_3$. In the third stage, one of the two drivers has its input terminal connected to the output node of the second stage, and the other of the two drivers has its input terminal connected for receiving a fourth input signal $S_4$. In this way during operation, the output node of the first stage supplies the complement of the AND function $S_1S_2$, the output node of the second stage supplies the AND function $S_1S_2S_3$, and the output node of the third stage supplies the complement of the AND function $S_1S_2S_3S_4$. By means of an inverter, any such complement of the AND function can be converted into the AND function itself, if desired.

In another specific embodiment of the invention, a carry look-ahead circuit for three bits (or more) is implemented in three stages (or more) so that all paths from the output node of each stage through the logic network to the power terminal have at most two driver transistors. By contrast, in prior art carry look-ahead circuits for three bits (or more) required logic networks in which there are undesirable paths containing four (or more) driver transistors connected in series. See, for example, a paper by C. M. Lee et al entitled "Current Status and Future Projection of CMOS Technology," published in *Computer Networks, Proceedings of the 25th IEEE Computer Society International Conference* (CompCon 82), Washington, D.C., September 1982, pp. 716-719, at p. 719, FIG. 1.

BRIEF DESCRIPTION OF THE DRAWING

FIGS. 2, 3, and 4 show a zipper CMOS logic circuit arrangement implementing a carry look-ahead, in accordance with yet another specific embodiment of the invention.

In particular, FIG. 4 shows the relationship of FIGS. 2 and 3.

Those transistor elements—such as transistor 201 (FIG. 1), for example—which are depicted with arrows pointing toward the element are NMOS transistors; those with arrows pointing away from the element—such as transistor 203, for example—are PMOS transistors. Logical complements of logic signals are represented by a bar placed over the symbol for such signals. For example, $\bar{S}_1$ represents the complement of $S_1$; that is, $\bar{S}_1 = 1 - S_1$ in logic value.

DETAILED DESCRIPTION

Figure 1:
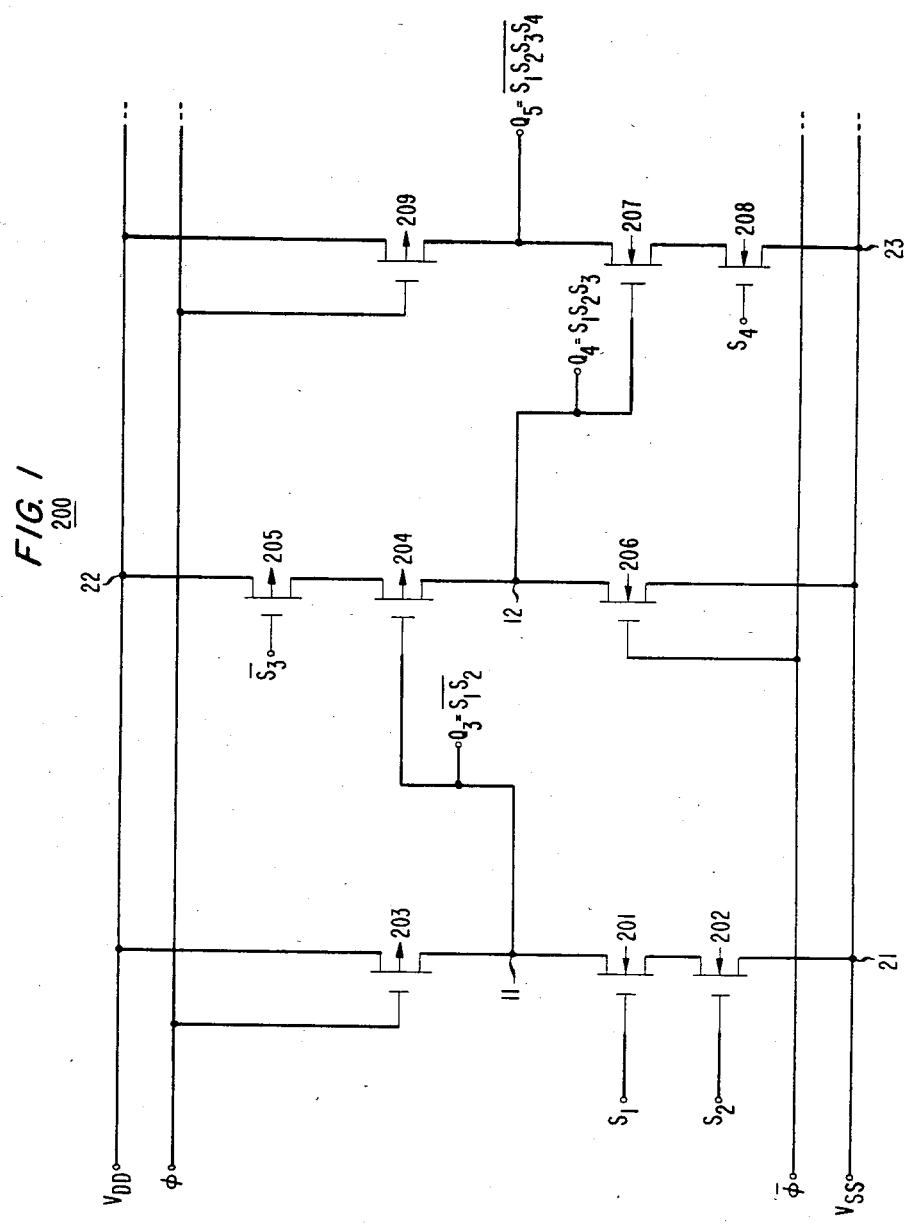
FIG. 1 shows a zipper CMOS logic circuit arrangement implementing a multiple AND function, in accordance with a specific embodiment of the invention.

The zipper CMOS circuit arrangement 200 shown in FIG. 1 implements multiple AND functions, in accordance with a specific embodiment of the invention; that is, the circuit 200 yields an overall output signal $Q_5$, as well as intermediate output signals $Q_3$ and $Q_4$, which represent the AND function, as well as partial AND function, with respect to input signals $S_1$, $S_2$, $\bar{S}_3$, and $S_4$ as follows: $\bar{Q}_3 = S_1$ AND $S_2$, $Q_4 = \bar{Q}_3$ and $S_3$, that is $Q_4 = S_1$ AND $S_2$ and $S_3$, and $\bar{Q}_5 = Q_4$ AND $S_4$, that is $\bar{Q}_5 = S_1$ AND $S_2$ AND $S_3$ AND $S_4$. In the binary logic notation, the AND functions are represented by products of logic functions: $\bar{Q}_3 = S_1 S_2$, $Q_4 = S_1 S_2 S_3$, and $\bar{Q}_5 = S_1 S_2 S_3 S_4$.

The circuit 200 itself comprises alternating stages of NMOS and PMOS precharging transistors 203, 206, and 209. The logic network of the first stage consists of NMOS driver transistors 201 and 202 connected mutually in series between the output node 11 and ($V_{SS}$) power terminal 21; the logic network of the second stage consists of PMOS driver transistors 204 and 205 mutually connected in series between the output node 12 and ($V_{DD}$) power terminal 22; and the logic network of the third stage consists of NMOS driver transistors 207 and 208 mutually connected in series between the output node 13 and ($V_{SS}$) power terminal 23. Note that the arrangement 200 does not require any power switches between logic networks and power lines, so long as inputs $S_1$ and $S_2$ are properly timed, that is, are never high during precharge phases. Typically, all PMOS transistors have a threshold of about 0.6 volt below $V_{DD}$, and all NMOS transistors have a threshold of about 0.6 volt above $V_{SS}$. Typically, $V_{DD}$ is about 5.0 volts and $V_{SS}$ is about 0 volt (substrate ground).

The operation of the logic circuit arrangement 200 can be understood as follows. During each precharge phase, the precharging transistors 203 and 209 are turned on by clock pulse sequence $\bar{\phi}$ and pull high (essentially to $V_{DD}$) the voltages of the output nodes 11 and 13, while the precharging transistor 206 is turned on by complementary clock sequence $\phi$ pulls low (essentially to $V_{SS}$) the voltage of output node 12. During each evaluation phase, all the precharging transistors are turned off, and the output node 11 of the first stage will go low if and only if both NMOS driver transistors 201 and 202 are on, that is, if and only if $S_1$ $S_2$ (inputs to drivers 201 and 202, respectively) are both logic 1. Thus, the voltage on the output node 11 during evaluation represents $Q_3$, the complement of the AND logic function, $S_1$ and $S_2$. On the other hand, during each evaluation phase, the output node 12 of the second stage will go high if and only if both PMOS driver transistors 204 and 205 are on, that is, if and only if $Q_3$ and $\bar{S}_3$ (input to driver 205) are both logic 0. Thus, the voltage on the output node 12 during evaluation represents the AND function of $\bar{Q}_3$ AND $S_3$, i.e., the multiple AND logic function $S_1$ AND $S_2$ AND $S_3$. Similarly, the voltage on the output node 13 during evaluation represents the complement of the multiple AND logic function $S_1$ AND $S_2$ AND $S_3$ AND $S_4$. In case undesirable sharing of charge between the output node of any stage and an internal node located between the two driver transistors of that stage becomes a problem, an auxiliary precharging transistor can be added. For example, between the output node 11 and a node between the driver transistor 201 and 202 there can be added an auxiliary transistor clocked by the sequence $\phi$ similar to the auxiliary transistor 303 in FIG. 2 described below.

Figure 2:
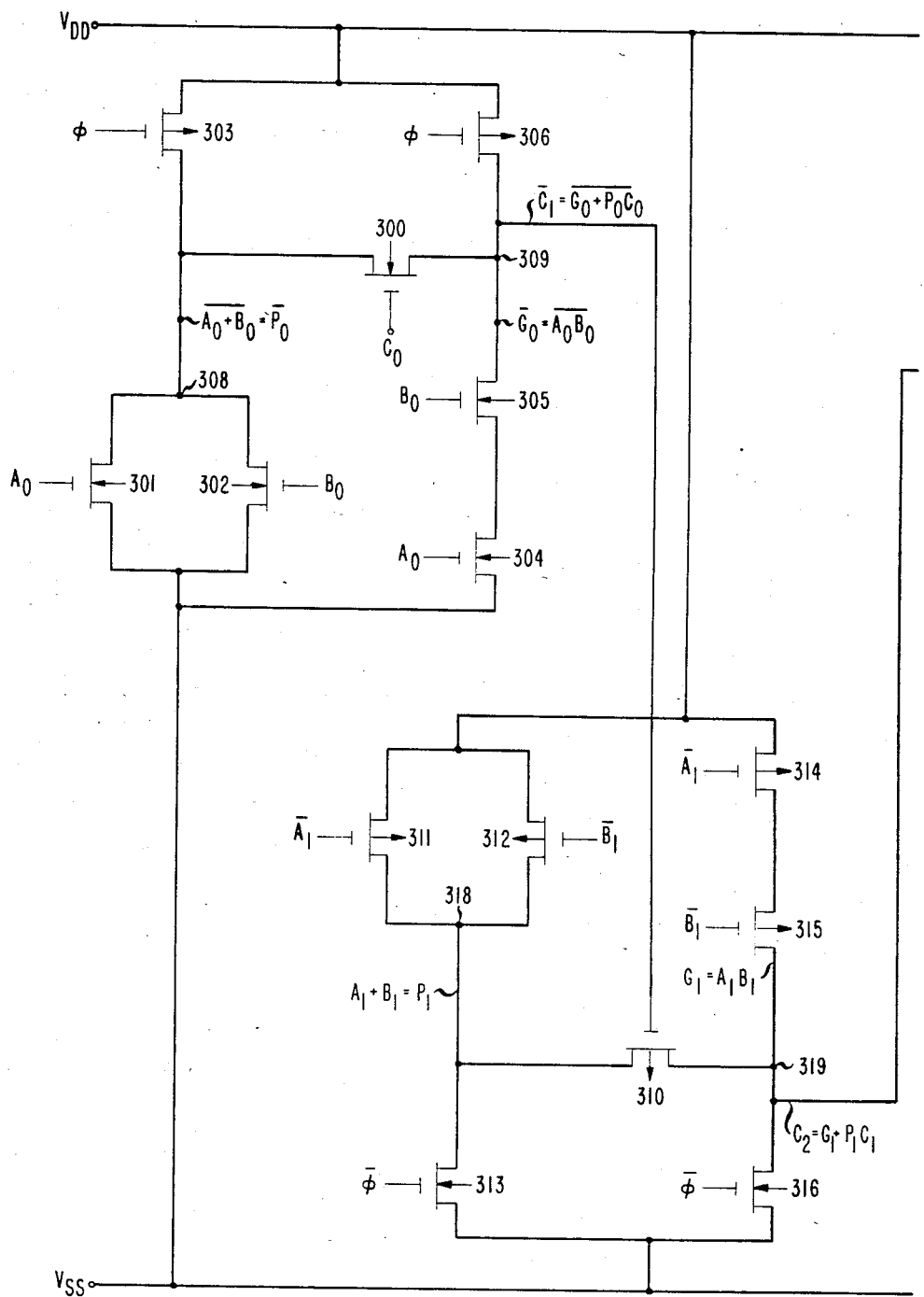
Figure 3:
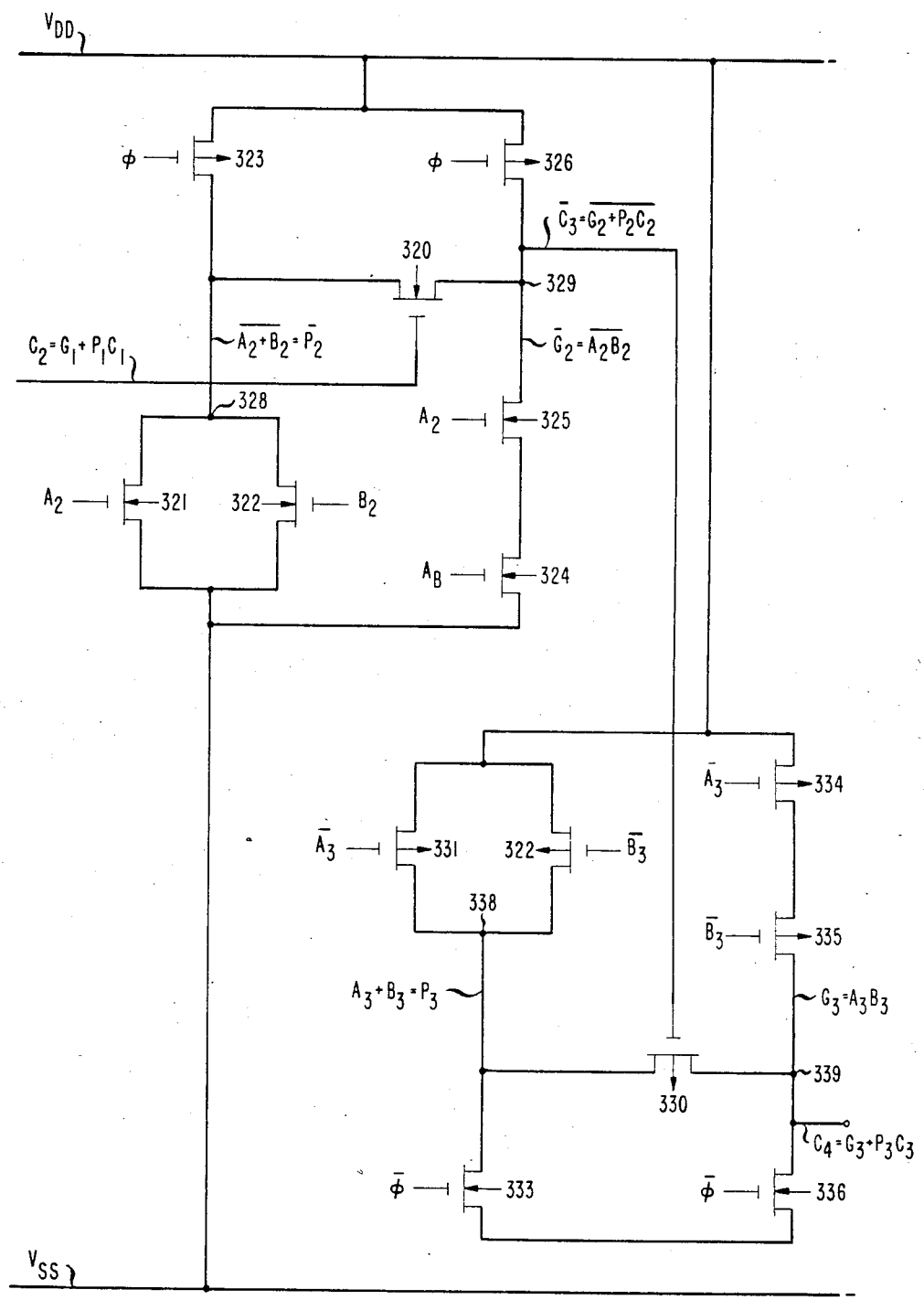

The zipper CMOS circuit arrangement 300 shown in FIGS. 2, 3, and 4 implements a carry look-ahead, that is, a logic circuit arrangement which implements the known recursion:

$$C_1 = G_0 + P_0 C_0 = \overline{G_0(\overline{P}_0 + \overline{C}_0)}$$

$$C_2 = G_1 + P_1 C_1$$

$$C_3 = G_2 + P_2 C_2, \text{etc.},$$

where $A_0$, $A_1$, $A_2$, ... and $B_0$, $B_1$, $B_2$, ... are input variables, $G_0 - A_0 B_0$, $G_1 = A_1 B_1$, $G_2 = A_2 B_2$, $G_3 = A_3 B_3$, etc., and $P_0 = A_0 + B_0$, $P_1 = A_1 + B_1$, $P_2 = A_2 + B_2$, $P_3 = A_3 + P_3$, etc. As known in the art, ech $P_i$ is the "propagate" variable of the i'th stage, each $G_i$ is a "generate" variable of the i'th stage, and $C_i$ is the "carry" variable of the i'th stage, useful for arithmetic calculations in an arithmetic logic unit. Here, in the circuit 300 the "carry" variable $C_i$ for all stages in response to a given input word $A_0 A_1 A_2 ... B_0 B_1 B_2 B_3 ...$ is available at the beginning of eahc evaluation phase, as is desired in a carry look-ahead chain, as taught for example in the textbook by H. Taub entitled *Digital Circuits and Microprocessors*, pp. 205-209 (1982). the carry variable $C_0$ as input to the first (left-hand-most) stage is useful for determining the other carry variables for the cases of simple addition $C_0 = 0$ or subtraction (two's complement) $C_0 = 1$.

In the circuit 300, the first stage, with the output $\bar{C}_1$, comprises a mutually parallel-connected pair of NMOS drivers 301 and 302 to which input signals $A_0$ and $B_0$, respectively, are applied, together with a mutually series-connected pair of NMOS drivers 304 and 305 to which $A_0$ and $B_0$, respectively, also are applied, as well as clocked PMOS precharging transistor 306, together with another NMOS driver transistor 300 to which the input carry signal $C_0$ is applied. The NMOS driver 300 is connected in series with the parallel-connected pair 301 and 302. An auxiliary precharging transistor 303 is advantageously added to ensure proper precharging of node 308, to avoid spurious partial discharge of the output node 309 during precharging whe internal node 308 would undesirably share charge with output node 309. If sharing of charge is not a problem, the auxiliary precharging transistor 303 can be omitted.

So long as this carry signal $C_0$, as well as $A_0$ and $B_0$, is properly timed, there is no need for a power switch (to $V_{SS}$) in this first stage; correspondingly, since the carry signals in the other stages are automatically properly timed, there is no need for a power switch in any of the other stages so long as their inputs $A_1B_1$, $A_2$, $B_2$, $A_3$, $B_3$, are also all properly timed.

All PMOS transistors in the circuit 300, just as in the circuit 200 (FIG. 1), have thresholds of about 0.6 volt below $V_{DD}$ (=5.0 volts); all NMOS transistors have thresholds of about 0.6 volt above $V_{SS}$ (=0.0 volt).

More specifically, the first stage of the logic circuit 300 delivers its output $\overline{C}_1$ to the gate of a PMOS driver transistor 310 of the second stage. During each of the precharging phases, both the node 308 and node 309 are charged to $V_{DD}$, so that the voltage then delivered to this PMOS transistor 310 is equal essentially to $V_{DD}$, and hence this PMOS transistor 310 is desirably off during precharging phases. On the other hand, during each of the evaluation phases, the voltage signal $\overline{C}_1$ delivered to the gate of transistor 310 will be high ($V_{DD}$) or low ($V_{SS}$) depending upon the logic values of the input variables $C_0$, $A_0$, and $B_0$ delivered to the gates of the driver transistors 300, 301, 302, 304, and 305. In particular, the node 308 will be driven low during evaluation if and only if either $A_0$ or $B_0$ is high, hence if and only if either $\overline{A}_0$ and $\overline{B}_0$ is low. Thus, the logic variable $\overline{P}_0$ representing the voltage at this node 308 is given by $\overline{P}_0 = \overline{A}_0 + \overline{B}_0 = \overline{A_0 B_0}$; so that $\overline{P}_0 = 0$ if and only if either $\overline{A}_0 = 0$ or $\overline{B}_0 = 0$, i.e., either $A_0 = a$ or $B_0 = 1$. Conversely, the output node 309 will be driven low during evaluation if and only if both $A_0$ and $B_0$ are high or if and only if $C_0$ is high while either $A_0$ or $B_0$ is high, hence if and only if both $\overline{A}_0$ and $\overline{B}_0$ are low or if and only if $P_0 C_0$ is high. Thus, the logic variable $\overline{G}_0$ produced by the operation of the drivers 304 and 305 is given by $\overline{G}_0 = \overline{A}_0 + \overline{B}_0 = \overline{A_0 B_0}$, so that $\overline{G}_0 = 0$ if and only if $\overline{A}_0 = \overline{B}_0$, i.e., $A_0 = a$ and $B_0 = 1$. Thus, first stage produces the logic variable $\overline{C}_1$, representing the voltage delivered to the gate of the transistor 310 of the second stage, given by $\overline{C}_1 = \overline{G}_0 + P_0 C_0$, as is desired for a complementary carry signal from the first stage to the second. Similarly, the other stages produce the desired carry signals $C_2$, $\overline{C}_3$, and $C_4$.

More specifically, the second stage (FIG. 2) of the logic circuit 300 comprises, in addition to the input driver 310, NMOS precharging transistors 313 and 316, PMOS drivers 311 and 312 for producing $P_1 = A_1 + B_1$, and PMOS drivers 314 and 315 for producing $G_1 = A_1 B_1$. This second stage delivers a carry signal $C_2 = G_1 + P_1 C_1$ to an NMOS input driver 320 of the third stage of the logic circuit 300. The third stage (FIG. 3) comprises driver and precharging transistors 321, 322, ... 326, and nodes 328 and 329, similar to those of the first stage; and so elements of the third stage corresponding to those of the first stage have the same reference numerals plus twenty. This third stage delivers a third carry signal $C_3 = G_2 + P_2 C_2$ to an input PMOS driver 330 of the fourth stage. The fourth stage also comprises precharging and driver transistors 331, 332, ... 336 similar to those of the second stage; and so elements of the fourth stage corresponding to those of the second stage are denoted by the same reference numerals plus twenty. The fourth stage delivers the fourth carry signals $C_4 = G_3 + P_3 C_3$, as indicated at the extreme right-hand end of FIG. 3.

In the circuit 300 it is assumed that the inputs $C_0$, $A_0$, $\overline{A}_1$, $A_2$, ..., $B_0$, $\overline{B}_1$, $B_2$, ... are properly timed so that during all precharge phases they maintain the respective drivers to which they are delivered in the off condition, and so that they turn them on (if at all) only during evaluation phases. If any such input is not thus properly timed, then a power switch should be inserted in the path between the corresponding driver transistor and the corresponding power line $V_{SS}$ or $V_{DD}$ depending upon whether such driver is NMOS or PMOS, respectively.

Although the invention has been described in terms of a specific embodiment, various modifications can be made without departing from the scope of the invention. It should be understood that the configurations of the clusters of drivers in the various stages illustrated in the Figures are merely exemplary and that other configurations can be implemented by the interconnection schemes using the same or a different number of drivers in the same or other series and parallel combinations and configurations in each stage. The basic operation, however, will be the same. For example, in order to implement the multiple AND function of seven input variables A, B, C, D, D, F, and G with three stages of zipper CMOS, each stage has three drivers connected in series, the three drivers in the first stage connected for receiving the inputs A, B, and C, respectively, the three drivers in the second stage for receiving the inputs D and E and the output of the first stage, respectively, and the three drivers in the third stage for receiving the inputs F and G and the output of the second stage, respectively. Alternatively, this same AND function can be implemented in zipper CMOS with six stages, each stage having two drivers, the two drivers in the first stage connected for receiving the inputs A and B, and the two drivers in each of the other stages connected for receiving the output of the immediately preceding stage and a different one of the other inputs. Also, instead of arranging the successive stages to form zipper CMOS, other arrangements can be used, such as domino CMOS or dynamic pseudo-NMOS.

What is claimed is:

1. A dynamic CMOS logic circuit for implementing a carry look-ahead for at least three bits comprising at least three successie stages controlled by the same timing signal in which the logic network in each stage consists essentially of a first separate pair of driver transistors mutually connected in series to an output node of that stage, a second separate pair of driver transistors mutually connected in parallel, and another driver transistor which is connected between said output node and the second pair of transistors and which in every stage expecting the first has its input terminal directly connected to the output node of the immediately preceding stage.

2. An integrated circuit comprising CMOS logic circuitry for implementing a carry look-ahead including at least three successive stages controlled by the same timing signal in which the logic network in each stage consists essentially of a first separate pair of driver transistors mutually connected in series to an output node of that stage, a second separate pair of driver transistors mutually connected in parallel, and another driver transistor which is connected between said output node and the second pair of transistors and which in every stage excepting the first has its input terminal directly connected to the output node of the immediately preceding stage.

3. An electronic data processing system including CMOS logic circuitry for implementing a carry lookahead including at least three successive stages controlled by the same timing signal in which the logic network in each stage consists essentially of a first separate pair of driver transistors mutually connected in series to an output node of that stage, a second separate pair of driver transistors mutually connected in parallel, and another driver transistor which is connected between said output node and the second pair of transistors and which in every stage expecting the first has its input terminal directly connected to the output node of the immediately preceding stage.

* * * * *